(12) United States Patent
Landesberger

(10) Patent No.: US 7,733,624 B2
(45) Date of Patent: Jun. 8, 2010

(54) METHOD AND DEVICE FOR ELECTROSTATIC FIXING OF SUBSTRATES WITH POLARIZED MOLECULES

(75) Inventor: Christof Landesberger, Graefelfing (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 291 days.

(21) Appl. No.: 12/089,972

(22) PCT Filed: Mar. 22, 2007

(86) PCT No.: PCT/EP2007/002555

§ 371 (c)(1),
(2), (4) Date: Apr. 11, 2008

(87) PCT Pub. No.: WO2007/110192

PCT Pub. Date: Oct. 4, 2007

(65) Prior Publication Data

US 2008/0232022 A1 Sep. 25, 2008

(30) Foreign Application Priority Data

Mar. 23, 2006 (DE) .................. 10 2006 013 517

(51) Int. Cl.
*H01T 23/0012* (2006.01)
(52) U.S. Cl. ...................... 361/234; 361/230
(58) Field of Classification Search .......... 361/230–234
See application file for complete search history.

(56) References Cited

U.S. PATENT DOCUMENTS

| | | | |
|---|---|---|---|
| 4,016,456 A | 4/1977 | Birks et al. | |
| 5,812,361 A | 9/1998 | Jones et al. | |
| 5,880,924 A | 3/1999 | Kumar et al. | |
| 6,185,085 B1 * | 2/2001 | Hwang et al. | ............... 361/234 |
| 6,238,160 B1 | 5/2001 | Hwang et al. | |
| 6,376,795 B1 * | 4/2002 | Zola | ...................... 219/121.43 |
| 7,027,283 B2 | 4/2006 | Landesberger et al. | |
| 2003/0178468 A1 | 9/2003 | Lee et al. | |
| 2006/0108231 A1 | 5/2006 | Weichart | |

FOREIGN PATENT DOCUMENTS

| | | |
|---|---|---|
| DE | 101 30801 A1 | 1/2003 |
| DE | 102 35 814 B3 | 3/2004 |
| DE | 10 2004 041 049 A1 | 1/2006 |
| EP | 1 662 559 A2 | 5/2006 |
| JP | 59-132139 A | 7/1984 |
| JP | 11-163110 A | 6/1999 |
| JP | 2006-149156 A | 6/2006 |

OTHER PUBLICATIONS

Official communication issued in the International Application No. PCT/EP2007/002555, mailed on Jul. 12, 2007.
Official communication issued in the International Application No. PCT/EP2007/002554, mailed on Jul. 27, 2007.

* cited by examiner

*Primary Examiner*—Danny Nguyen
(74) *Attorney, Agent, or Firm*—Keating & Bennett, LLP

(57) ABSTRACT

Method for handling a substrate with polarizable molecules including providing a carrier with a first junction electrode and disposing the substrate between the first junction electrode and a second junction electrode. Fixing the substrate on the carrier is achieved by applying a voltage between the first junction electrode and the second junction electrode, so that the polarizable molecules are polarized. After removing the second junction electrode, the substrate remains fixed on the carrier.

11 Claims, 1 Drawing Sheet

METHOD AND DEVICE FOR ELECTROSTATIC FIXING OF SUBSTRATES WITH POLARIZED MOLECULES

TECHNICAL FIELD

The present invention relates to a fixing of substrates on carrier systems by electrostatic attraction.

BACKGROUND

The fabrication of electronic systems on flexible substrates, such as plastic foils, paper or metal, is becoming more and more important. The following may be designated as future applications: flexible displays, flexible solar cells, flexible luminous areas, and, in general, electrical circuits which are easily deformable due to the flexibility of the substrate and, thus, may optimally fill predetermined housing volumes in a space-saving manner.

Printed circuits on the basis of organic materials, such as semiconductive polymers, polymer conductor trace materials, polymer dielectrics etc. are one current development focus in the area of flexible electronics. It is the printing technology in particular that offers a very cost-effective processing technique. In connection with flexible substrates, continuous roll-to-roll production techniques may be utilized for this purpose. During the development phase of new methods and materials for flexible electronics, however, continuous roll-to-roll processes are too expensive. Here, it would be advantageous to be able to process the flexible substrates also as single sheets in plants and process systems. This would also open up the possibility of using already existing production plants for flexible substrates, too.

However, handling single flexible substrates is difficult. For coating processes with liquid media, drying processes in the oven or in a lithographic patterning, the foils must be flat-fixed on a platen and additionally be capable of being processed with automatic handling systems.

If mounted onto rigid substrates, single flexible foils may be processed in coating plants. A simple variant for this purpose is to stick the edges of a foil sheet on a rigid carrier plate with slightly larger dimensions, by means of sticky tape. However, this is associated with a significant amount of manual work. Also, stripping the sticky tapes after temperature steps is often difficult or associated with significant remains. Additionally, in the case of drying processes on hotplates, no uniform, planar heat contact is present; air bubbles and cambers of the foils prevent a really flat resting of the substrate sheet. A non-uniform heat contact and a corrugated form of the substrate inevitably lead to non-uniform layer thicknesses, which, in the case of conducting or semiconducting layers, leads to highly varying and, thus, useless electronical properties.

In principle, a full-area sticking of the foil to the carrier substrate is possible; however, this is associated with even larger processing expenses. For this reasons, re-detachable sticking techniques do not present any cost-effective and practicable solution. Alternatively, the foils may be fixed on perforated vacuum suction plates. Then, however, the automatical charging and discharging of the corrugated foils is still not solved in a reasonable manner.

Electrostatic holding techniques for thin substrates are known, too, wherein unipolar and bipolar holders, or carriers, are distinguished. In the case of the unipolar carrier, the carrier plate comprises only one junction electrode and, accordingly, only carries charges of one polarity (unipolar). With a bipolar carrier, a carrier plate comprising at least two electrically separated junction electrodes charged with opposite polarities is utilized. A device for a unipolar carrier is described in JP 59132139, and a corresponding method for holding is indicated in DE 10235814 B3. This holding is suitable for electrically conducting substrates, wherein a layer with a high dielectrical constant is put between the substrate and the carrier plate, so that fixing of the substrate is made by dielectrical polarization. Furthermore, a mobile holder based on a bipolar carrier is described in WO 02111184 A1. This holding is provided for wafers.

These electrostatic methods have the benefits of a good planar contact pressure, an easy detachability of the electrostatic carrier, and an automatization without any problems. It has turned out, however, the foils such as PET (PET=polyethylene terephthalate, polyester) or polyimide comprise holding forces which are too weak towards electrostatic fields, and for this reason, these methods, or devices, do not provide any reliable holding for these materials. Due to the increasing importance of these materials, the current situation is not satisfactory.

SUMMARY

According to an embodiment, a method for handling an electrically insulating solid substrate having polarizable molecules may have the steps of: providing a carrier having a first junction electrode; disposing the electrically insulating solid substrate between the first junction electrode and a second junction electrode, and applying a voltage between the first junction electrode and the second junction electrode, so that the polarizable molecules are polarized and the electrically insulating solid substrate is thereby fixed on the carrier; and removing the second junction electrode, wherein the substrate remains fixed on the carrier.

According to another embodiment, a device for handling a substrate having polarizable molecules may have: a carrier with a first junction electrode; a second junction electrode, wherein the first junction electrode and the second junction electrode are formed such that the substrate may be placed therebetween and the second junction electrode is formed as a foil electrode; and a means for applying such a voltage between the first junction electrode and the second junction electrode that the polarizable molecules are thereby polarizable and the substrate is thereby fixed on the carrier; and a means for removing the second junction electrode.

The present invention provides a method for fixing a substrate with polarizable molecules on a carrier with a first junction electrode, the substrate being arranged between the first junction electrode and a second junction electrode, and a polarization of the polarizable molecules being caused by applying a voltage between the first junction electrode and the second junction electrode. Subsequently, the second junction electrode is removed, wherein the substrate remains fixed on the carrier since the first junction electrode is formed such that charges deposited onto it remain there when applying the voltage, by insulating the first junction electrode from the environment when switching off the voltage so that the charges cannot drain off. This method is particularly suitable for fixing non-conducting substrates, such as plastic foils, which do not comprise any electrically conducting layer.

The voltage, or an electrical potential, is supplied by a voltage source, and an electrical attraction after applying the potential is caused by molecular dipoles in the substrate, which are aligned between both the junction electrodes in correspondence to the homogeneous electrical field. After a short time (in seconds or minutes, for example) the voltage source may be disconnected in one embodiment, and the second junction electrode is stripped. In this context, disconnecting is made such that charges with opposite polarity remain on both junction electrodes. Here, the substrate to be adhered remains fixed on the carrier since it continues to be attracted via the aligned dipoles in the substrate and the charged junction electrode of the carrier. To strengthen the holding force and at the same time prevent an electrical breakdown, the carrier may comprise an insulating layer.

Detaching the substrate from the carrier may occur by discharging both the junction electrodes, i.e. switching on and off the holding force is made by charging and discharging the junction electrodes. In a discharged state, no electrostatic attraction is acting, and the substrate detaches itself from the carrier.

The inventive concept offers a variety of advantages over known methods and devices. For example, materials which are not form-stable, such as flexible foils, may be very easily fixed on a rigid carrier and may be very easily detached, too. This carrier technique is temperature-stable, and the carrier plates are reusable. No additional sticking processes need to be performed. A contamination with chemicals or solvents from glues or wax is avoided. Cleaning is not necessary either after detaching the substrate from the carrier. The insulation layer may be chosen in correspondence to the requirements of the processing processes desired.

The carrier guarantees a very uniform full-area contact between the substrate and a carrier plate. This is of great importance for coating, layer curing and lithographic patterning. It is to be expected that very uniform layer thicknesses may be achieved and the layers are just slightly stressed, or the layers comprise a layer stress which is well reproducible. This may not be achieved with the known up to date.

Finally, it is an advantage of the present invention that not only fixing but also detaching the substrates is possible without any problems. Fixing and detaching substrates may additionally be made very quickly and automatically, that is, it does not need to be performed manually.

BRIEF DESCRIPTION OF THE DRAWINGS

An embodiment of the present invention will be detailed subsequently referring to the appended drawing, in which.

DETAILED DESCRIPTION

Figure 1:
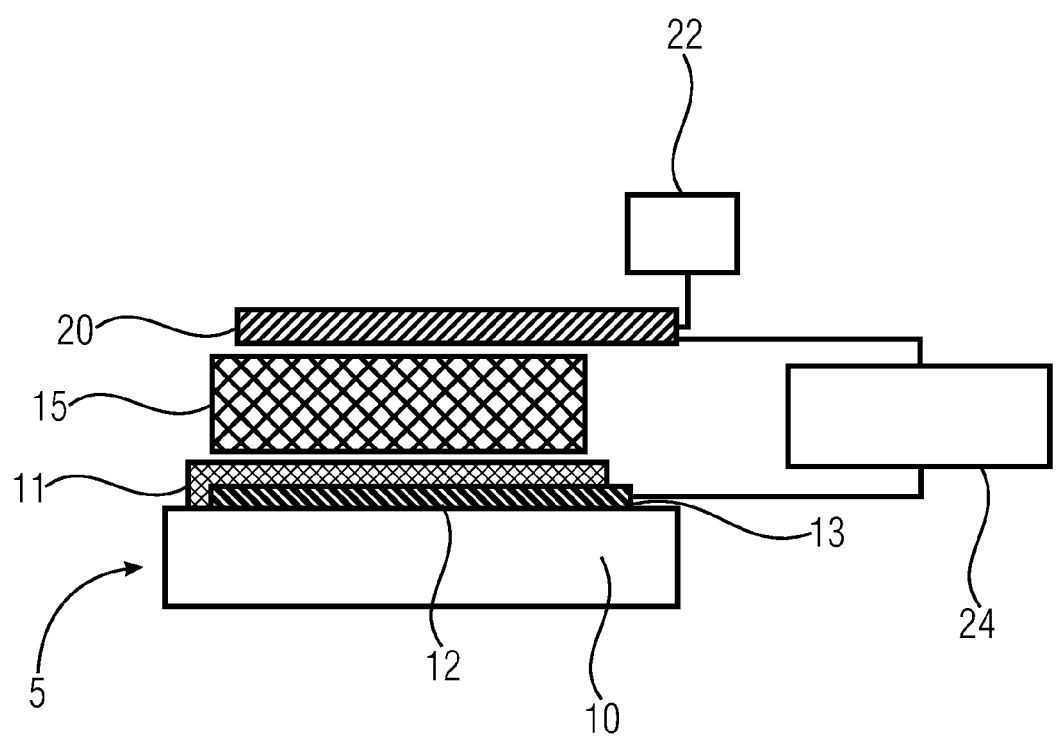
FIG. 1 is a cross-section of a carrier with a substrate.

FIG. 1 shows a cross-section of an embodiment of a carrier 5 which may be used in the inventive method. Carrier 5 consists of a carrier plate 10 with an insulation layer 11 and a first junction electrode 12. The insulation layer 11 does not fully cover the junction electrode 12, but leaves a contact electrode 13 uncovered. A substrate 15 is placed onto this carrier 5, and a second junction electrode 20 is placed over it. Placing and removing second junction electrode 20 may be made automatically via a means 22 schematically illustrated which may cause establishing a contact of substrate 15 with the second junction electrode 20 and removing the second junction electrode 20 after an electrostatic charging process of the first junction electrode 12 and the second junction electrode 20 with charges of opposite polarity.

Charging is caused by a means for applying a voltage 24, and the charging voltage may range from 200 volts to 3000 volts, for example. In one embodiment, the voltage is applied to the first junction electrode 12 and the second junction electrode 20 only until a fixing of substrate 15 is established on carrier 5. Afterwards, the voltage is disconnected such that charges through which substrate 15 remains fixed via its formed dipoles remain on the first junction electrode 12. The second junction electrode 20, which may also be referred to as a counter electrode, is then removed so that it is possible to process substrate 15 from the side opposite to carrier 5. Embodiments of the present invention further include one or several steps of processing substrate 15 in the state fixed on carrier 5. Such steps may be coating, lithography, drying and heating processes, patterning processes, thinning, grinding and the like, for example.

In a further embodiment, the means for applying voltage 24 between the first junction electrode 12 and the second junction electrode 20 may permanently maintain a potential.

After the second junction electrode 20 has been removed and substrate 15 is fixed on carrier 5 due to the electrostatic attraction, substrate 15 may be processed, or treated, in further steps, as has been set out. The connection between substrate 15 and carrier 5 may be detached by re-applying second junction electrode 20 and subsequently discharging first junction electrode 12 and second junction electrode 20. The discharging causes disappearing of the electrostatic attraction, and, consequently, also canceling the fixing of substrate 15 on carrier 5.

The second junction electrode 20 may be embodied as a flexible foil electrode or as a rigid body. In any case, removing the second junction electrode 20 should be performed in such a manner that substrate 15 remains fixed on carrier 5 and does not adhere to the second junction electrode 20. This may be achieved if removing is made such that no full-area force acts on substrate 15, but only a force acting in some points or lines. In the case of a flexible second junction electrode 20, this may be made by peeling off, and in the case of a rigid second junction electrode 20, this may be made by tilting. Tilting, or peeling off, causes a high stripping force along a line and not along an area, such as with horizontal lifting off. Thus, it may be ensured that substrate 15 will not remain adhered to the second junction electrode 20 when lifting off the second junction electrode 20. For an inventive functioning, it is thus important to ensure that the stripping force substantially acts only on junction electrode 20 and not on substrate 15.

In another embodiment, however, an adhesion of substrate 15 at the second junction electrode 20 may be advantageous for a further step of the method. This is the case, for example, if, after processing substrate 15, removal of substrate 15 from carrier 5 is to be made. For this purpose, an electrostatic attraction between the second junction electrode 20 and substrate 15 may be caused by applying a corresponding voltage between the first junction electrode 12 and the second junction electrode 20, whereupon the charges are left on the second junction electrode 20 and not on the first junction electrode 12. Thus, the second junction electrode 20 may be removed from carrier 5, including substrate 15.

In a further embodiment, second junction electrode 20 may also be embodied as a foil junction electrode. In this embodiment, the second junction electrode 20 is flexible, facilitating peeling off, so that such an embodiment may be advantageous. The second junction electrode 20 may be a metal foil or a foil with a conducting coating, for example.

In principle, the area of the first junction electrode 12 and/or the second junction electrode 20 may be larger or smaller than substrate 15. However, it may be advantageous for the area of the second junction electrode 20 to be slightly smaller than the disposed substrate 15, so as to avoid electrical breakdowns, for example. Advantageously, the first junction electrode 12 is slightly larger than the area of substrate 15.

In further embodiments, the first junction electrode 12 and the second junction electrode 20 may have another shape, that is, substrate 15 does not need to be covered over the full area. Likewise, insulation layer 11 does not need to be part of carrier 5. Insulation layer 11 may be part of substrate 15, for example, or insulation layer 11 may completely be omitted for substrates 15 of certain materials, or with a certain thickness. This is possible if an electrical breakdown, or secure fixing, may also be ensured without insulation layer 11. Finally, insulation layer 11 does not need to be fixedly connected to carrier 5, but instead may be loosely laid on carrier 5 or substrate 15.

In further embodiments, substrate 15 may also comprise thin, pliable glass or ceramic substrates, apart from plastic foils and thin semiconductors. Furthermore, in further embodiments, the action of electrostatic fixing (applying a voltage between the electrodes) may be also be made under vacuum conditions, for example, it may be performed within a vacuum chamber. For example, this may be advantageous in that air bubbles which might otherwise be enclosed between substrate 15 (foil) and carrier 5 may thereby be avoided. With contacting under air (outside a vacuum chamber, or under usual air pressure conditions), such bubbles cannot be precluded and may lead to cambers, which is disadvantageous for later processes (e.g. sputtering, plasma etching) under vacuum conditions.

Additionally, a reversible joining of the edge region between the foil and carrier 5 may be performed in further embodiments, which may be particularly advantageous with regard to basin processes. For example, a polyimide foil may be electrostatically fixed and spun-on with polyimide. Subsequently, the layer may be baked at 300 to 400° C., for example, so that the foil edge would be joined. Subsequent to that, carrier 5 might also be deployed in basin processes (cleaning, photo technique etc.).

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for handling an electrically insulating solid substrate comprising polarizable molecules, comprising:
    providing a carrier comprising a first junction electrode;
    disposing the electrically insulating solid substrate between the first junction electrode and a second junction electrode, and applying a voltage between the first junction electrode and the second junction electrode, so that the polarizable molecules are polarized and the electrically insulating solid substrate is thereby fixed on the carrier; and
    removing the second junction electrode, wherein the substrate remains fixed on the carrier.

2. The method according to claim 1, wherein an insulation layer is disposed between the substrate and the first junction electrode and/or the second junction electrode.

3. The method according to claim 1, wherein the second junction electrode is removed such that a stripping force then acting acts along a line.

4. The method according to claim 3, wherein the second junction electrode is flexible and is peeled off for being removed from the electrically insulating solid substrate.

5. The method according to claim 1, wherein the second junction electrode is rigid and is tilted for being removed from the electrically insulating solid substrate.

6. The method according to claim 1, wherein applying a voltage is made in a vacuum.

7. A device for handling a substrate comprising polarizable molecules, comprising:
    a carrier with a first junction electrode;
    a second junction electrode, wherein the first junction electrode and the second junction electrode are formed such that the substrate may be placed therebetween and the second junction electrode is formed as a foil electrode; and
    a unit for applying such a voltage between the first junction electrode and the second junction electrode that the polarizable molecules are thereby polarizable and the substrate is thereby fixed on the carrier; and
    a remover for removing the second junction electrode.

8. The device according to claim 7, further comprising an insulation layer disposed between the substrate and the first junction electrode and/or the substrate and the second junction electrode.

9. The device according to claim 7, wherein the remover for removing is formed such that the second junction electrode is removable such that a stripping force then acting acts along a line.

10. The device according to claim 7, wherein the first junction electrode comprises a larger area than the second junction electrode.

11. The device according to claim 7, wherein the carrier is disposed in a vacuum chamber.

\* \* \* \* \*